(12) United States Patent
Wiedemuth et al.

(10) Patent No.: US 7,408,329 B2
(45) Date of Patent: Aug. 5, 2008

(54) POWER SUPPLY UNIT FOR GAS DISCHARGE PROCESSES

(75) Inventors: Peter Wiedemuth, Herbolzheim (DE); Stefan Schirmaier, Freiburg (DE); Markus Winterhalter, Bad Krozingen (DE)

(73) Assignee: Huettinger Elektronik GmbH + Co. KG, Freiburg (DE)

( * ) Notice: Subject to any disclaimer, the term of this patent is extended or adjusted under 35 U.S.C. 154(b) by 302 days.

(21) Appl. No.: 11/226,473

(22) Filed: Sep. 15, 2005

(65) Prior Publication Data
US 2006/0076904 A1   Apr. 13, 2006

Related U.S. Application Data

(63) Continuation of application No. PCT/EP2004/02426, filed on Mar. 10, 2004.

(30) Foreign Application Priority Data
Mar. 21, 2003   (DE)  ............................ 103 12 549

(51) Int. Cl.
*G05F 1/613*   (2006.01)
*H05B 41/16*   (2006.01)
(52) U.S. Cl. ............... 323/224; 323/228; 323/266; 323/282; 315/247; 315/246; 315/224; 315/209 R
(58) Field of Classification Search ............... 315/247, 315/246, 244, 225, 209 R, 200 R, 291, 307, 315/297, 224; 323/224, 228, 266, 259, 282
See application file for complete search history.

(56) References Cited

U.S. PATENT DOCUMENTS

| | | | |
|---|---|---|---|
| 3,913,000 A * | 10/1975 | Cardwell, Jr. ............... 363/20 |
| 4,803,610 A * | 2/1989 | Gulczynski ............... 363/70 |
| 5,426,346 A | 6/1995 | Allison |
| 5,481,163 A | 1/1996 | Nakamura et al. |
| 5,717,293 A | 2/1998 | Sellers |
| 5,861,734 A * | 1/1999 | Fasullo et al. ............... 323/222 |
| 5,940,280 A * | 8/1999 | Murai et al. ............... 363/17 |
| 6,020,719 A * | 2/2000 | Nishigaki et al. ............ 320/128 |
| 6,052,790 A | 4/2000 | Brown |
| 6,122,183 A * | 9/2000 | He et al. ............... 363/44 |
| 6,198,257 B1 * | 3/2001 | Belehradek et al. ............ 323/222 |
| 7,023,186 B2 * | 4/2006 | Yan ............... 323/225 |
| 7,164,591 B2 * | 1/2007 | Soldano ............... 363/89 |
| 7,279,868 B2 * | 10/2007 | Lanni ............... 323/222 |
| 7,283,379 B2 * | 10/2007 | Baker et al. ............... 363/98 |

(Continued)

FOREIGN PATENT DOCUMENTS

DE   35 38 494 A1   5/1987

(Continued)

*Primary Examiner*—Tuyet Vo
(74) *Attorney, Agent, or Firm*—Fish & Richardson P.C.

(57) ABSTRACT

A method of generating an output DC voltage of a gas discharge process voltage supply unit, in which in a first voltage transformation stage a first DC voltage is transformed into a second DC voltage of a predetermined voltage range, and the output DC voltage is generated from the second DC voltage in a second voltage transformation stage. A switching element of at least one boost converter is switched with a controlled pulse-duty factor for generating the output DC voltage in the second voltage transformation stage. This method permits striking and maintenance of a plasma process.

19 Claims, 2 Drawing Sheets

U.S. PATENT DOCUMENTS

| | | |
|---|---|---|
| 2002/0136029 A1 | 9/2002 | Ledenev et al. |
| 2006/0028186 A1* | 2/2006 | Yan .......................... 323/225 |
| 2006/0152947 A1* | 7/2006 | Baker et al. ................. 363/16 |
| 2007/0096700 A1* | 5/2007 | Weng et al. ................. 323/222 |

FOREIGN PATENT DOCUMENTS

| | | |
|---|---|---|
| DE | 38 30 460 A1 | 3/1990 |
| DE | 3830460 | 3/1990 |
| DE | 39 24 398 A1 | 1/1991 |
| DE | 40 17 207 A1 | 12/1991 |
| DE | 40 23 253 A1 | 1/1992 |
| DE | 44 28 850 A1 | 2/1995 |
| DE | 196 27 497 A1 | 4/1997 |
| DE | 195 43 419 A1 | 5/1997 |
| DE | 199 17 180 A1 | 10/1999 |
| DE | 100 15 244 | 10/2001 |
| JP | 6-165484 | 6/1994 |
| JP | 7327361 | 12/1995 |
| JP | 2002-153068 | 5/2002 |
| JP | 2002325458 | 11/2002 |
| KR | U1998-067277 | 12/1998 |
| KR | 1020010104405 | 11/2001 |
| WO | WO02/17469 | 2/2002 |

* cited by examiner

POWER SUPPLY UNIT FOR GAS DISCHARGE PROCESSES

This is a continuation of international application PCT/EP2004/02426, filed Mar. 10, 2004, designating the U.S. and claiming priority under 35 U.S.C. §119 from German application DE 103 12 549.3, filed Mar. 21, 2003. The entire contents of these priority applications are incorporated herein by reference.

TECHNICAL FIELD

The invention concerns a method for generating an output DC voltage of a power supply unit for gas discharge processes, and a device for carrying out the method.

BACKGROUND

In some methods of generating an output DC voltage of a power supply unit for gas discharge processes, a first DC voltage is transformed into a second DC voltage of a predetermined voltage range in a first voltage transformation stage, and in a second voltage transformation stage the output DC voltage is generated from the second DC voltage. A method of this type and a corresponding device are disclosed, for example, in DE 196 27 497 A1.

Gas discharge processes have different impedances due to the most different requirements in the process and particularities of the system technology. This means that different discharge voltages must be provided to obtain the required specific power conversion. Moreover, the voltage required for striking a gas discharge process is often higher than that for maintaining the gas discharge process.

DE 196 27 497 A1 discloses a plasma generator with a strike enhancement circuit. The strike enhancement circuit generates a high voltage at a high impedance to initiate a plasma in a plasma or sputter chamber. The strike enhancement circuit has a plurality of diode bridges which act as full-wave rectifiers. The transformer secondary of the power supply is connected to the alternating current (AC) inputs of each diode bridge via isolation capacitors. The direct current (DC) connections of the diode bridges are connected in series and the added voltage is supplied to the plasma chamber via the input connections. Each diode bridge also comprises a storage capacitor which connects positive and negative DC connections. Positive and negative voltage peaks of the transformer secondary waveform are stored in the storage capacitors. A voltage is present at the DC outputs, which is large enough to initiate plasma discharge. If plasma is present, the impedance of the isolation capacitors prevents the strike circuit from supplying the high strike voltage. The conventional device and the associated method are typically not suited to control the DC voltage at the output of the plasma generator over a wide voltage range.

SUMMARY

In various aspects, the present invention features a method, and a device for carrying out the method, which permit setting of a wide range of output voltages with predetermined nominal output power.

In one aspect of the invention, a switching element of at least one boost converter is switched with a controlled pulse-duty factor. The first voltage transformation stage generates a first DC voltage which is suited, in particular, for normal operation of a gas discharge process, such as for maintaining a gas discharge process. The supply voltage of the gas discharge process can thereby be adjusted via the first voltage transformation stage. The output voltage may be increased in the second voltage transformation stage, in particular, for striking the gas discharge process. When the gas discharge process has been struck, the output voltage can be controlled via the second voltage transformation stage while the gas discharge process is being maintained. In particular, the power in the upper output voltage range can be adjusted through the second voltage transformation stage. With this action, only the active elements of the boost converter need be selected, depending on the maximum admissible output voltage. The components of the first voltage transformation stage are not dependent thereon. Switching of the switching element of the boost converter with a controlled pulse-duty factor is advantageous in that the boost converter is resistant to open circuit operation. It is thereby possible to prevent energy from being pumped from the inductance into the filter capacitor of the boost converter with each cycle, thereby preventing an increase in the output DC voltage in the unloaded state, which could destroy the components. Moreover, the output DC voltage can be adjusted through controlling the pulse-duty factor. In particular, the pulse-duty factor can be set to zero, such that the output DC voltage corresponds to that of the second DC voltage.

In a particularly preferred method variant, the second DC voltage in the second current transformation stage is increased. The increase in the second DC voltage permits, in particular, striking of the gas discharge process without requiring additional strike enhancement circuits.

In one method variant, the output DC voltage can be generated from the second DC voltage by switching the switching elements of at least two boost converters with a controlled pulse-duty factor in a temporally offset manner. This is advantageous in that the switching elements can be operated at lower frequencies, providing optimum function of the switching elements. Moreover, a filter capacitor at the output of the second voltage transformation stage may have a smaller capacitance, which provides fast disconnection of the voltage supply unit. Fast switching may be required, in particular, if so-called arcs occur in the plasma process. These arcs can produce instabilities in the plasma process and can destroy the cathode or other elements in the plasma chamber. If such an arc occurs, the voltage supply should be quickly switched off. After disconnection, only a small residual energy remains in the overall system (i.e., in the current supply and the plasma system). Another advantage is that with the use of two boost converters that switch in a temporally offset manner with a controlled pulse-duty factor, a smooth (substantially ripple-free) DC voltage can be generated at the output of the voltage supply unit.

According to another aspect of the invention, an output DC voltage is generated from an input DC voltage by switching the switching elements of at least two boost converters in a temporally offset manner with a controlled pulse-duty factor. In a particularly preferred manner, the boost converters are connected in parallel and the input DC voltage is increased to an output DC voltage.

With particular preference, the switching element is driven with a frequency greater than or equal to 18 kHz, since oscillations which are excited (for example, in transformers) at these frequencies are not audible. Moreover, passive components (such as transformers) may have a smaller size.

The switching elements are preferably driven with the same frequency or with a multiple of a predetermined basic frequency, thereby preventing beats. Beats may be generated, for example, if the switching elements are driven with different driving frequencies. This would be the case with variablefrequency control, for example. Driving of the switching elements at the same frequency or a multiple of a predetermined basic frequency can result in an improved electromagnetic compatibility (EMC). Mutual influence by the switching elements and influence by other components or external devices is thereby substantially prevented.

In a preferred method variant, the first DC voltage is initially converted into an AC voltage which is subsequently rectified to the second DC voltage. The input voltage of the second current transformation stage can thereby be adjusted. Moreover, the potentials of the input and output of the first current transformation stage can be separated within the first current transformation stage. The amplitude of the AC voltage can be adjusted, as well as the wave shape of the AC voltage.

In a preferred further development of the method, the AC voltage is generated by a bridge circuit of switching elements, in which the switching elements can be driven in a pulse-width-modulated or phase-shifted manner, permitting on the one hand power adjustment for low load voltages and on the other hand transformation of the input voltage of the first voltage transformation stage. Moreover, the waveform of the AC voltage can be freely adjusted. The bridge circuit may be embodied as a semi-bridge or as a full bridge.

In a particularly preferred manner, the switching elements of the bridge circuit and the switching elements of the boost converter(s) are driven at the same frequency or at a multiple of a predetermined basic frequency. Beating behavior can thereby be eliminated. The common control of the switching elements has a positive effect on the electromagnetic compatibility. The first and second voltage transformation stages do not influence each other.

With particular preference, the AC voltage is transformed before rectification. Transformation permits potential separation. Moreover, the input voltage of the second voltage transformation stage can be adjusted and, if the voltage in the second voltage transformation stage does not increase, the output voltage of the voltage supply unit can also be adjusted.

The first DC voltage is preferably generated from a mains voltage through rectification. This is advantageous in that the entire power supply arrangement can be operated at almost any mains voltage. Plasma systems can be operated at the most different mains voltages and for the most different output DC voltages with exactly the same voltage supply arrangement.

Preferably, the second DC voltage of a voltage less than 650 V, preferably in the range between 50 to 650 V, is generated from the first DC voltage, and the output DC voltage of a voltage greater than 600 V, preferably in the range between 600 to 2000 V, is generated from the second DC voltage. The first voltage transformation stage thereby generates a relatively low output DC voltage, in particular, to maintain a gas discharge process, or for low load impedance and high output current, and the second voltage transformation stage generates a higher output voltage, in particular, for striking a gas discharge process, or for power adjustment in the upper output voltage range (in other words, at high load impedance and consequently high output DC voltage). If, therefore, a small voltage is generated in the first voltage transformation stage and a large voltage is generated in the second voltage transformation stage, only the second voltage transformation stage requires use of components designed for high voltages. The safety distance between the elements of the first voltage transformation stage may be smaller due to the reduced voltages.

Another aspect of the invention features a plasma process DC voltage supply unit, a first voltage transformation stage for transforming a first DC voltage into a second DC voltage, and a second voltage transformation stage for transforming the second DC voltage into an output DC voltage. For generating the output DC voltage, the second voltage transformation stage has at least one boost converter with a switching element driven with a controlled pulse-duty factor. A DC voltage supply unit of this type can be used over a wide input voltage range and required output DC voltage range. The first voltage transformation stage may be any DC/DC converter (for example, a buck converter), a boost converter or a combination thereof. The first DC voltage can be increased or reduced in the first voltage transformation stage.

A control unit is preferably provided to control the first and second voltage transformation stages. The common control of the first and second voltage transformation stages by the control unit in connection with use of a boost converter in the second voltage transformation stage can permit reliable striking of a gas discharge process and also continuous adjustment of the output DC voltage in accordance with the plasma process requirements. It is also feasible to provide each voltage transformation stage with its own control unit.

In a preferred embodiment, at least two boost converters, which are connected in parallel, are provided in the second voltage transformation stage to protect the components in the second voltage transformation stage. The switching elements may, in particular, be operated at a lower frequency compared to use of one boost converter only. The second voltage transformation stage, which comprises at least two boost converters connected in parallel, may also be regarded as a separate aspect of the invention. The boost converters can be connected to a common DC voltage supply or each boost converter may have its own DC voltage supply.

Preferably, the boost converters have a common filter capacitor. Filter capacitors having a very small capacitance may be used for a predetermined maximum output DC voltage, which permits rapid discharge of the capacitor, thereby protecting the plasma process DC voltage supply unit. This action can also protect the elements of the plasma process, such as substrate and targets.

It is possible to use relatively inexpensive switching elements, such as transistors, if the switching elements of the boost converters are driven temporally offset. Due to temporally offset driving of the switching elements, the individual switching elements may be operated at a lower frequency.

In a preferred embodiment, the first voltage transformation stage comprises an inverter that is driven by the control unit, for example, for generating an AC voltage from the first DC voltage, a transformer connected to the inverter for voltage transformation of the AC voltage, and a rectifier for generating the second DC voltage. This device permits adjustment of the output DC voltage for low output DC voltages. The use of the transformer permits potential separation between the voltages at the input and output of the current supply unit, in particular between the mains-side voltage and the voltage of the plasma process, which is often necessary for plasma processes.

In a preferred further development, the inverter is embodied as a bridge circuit, which enables influencing the amplitude and wave shape of the AC voltage generated in the inverter. By suitable driving of the switching elements of the bridge circuit, the amplitude of the input DC voltage can be reduced. The driving frequency and the pulse-duty factor used for driving the switching elements can influence the wave shape of the generated AC voltage. The output AC voltage can thereby be adjusted such that the dimensions of the transformer in the first voltage transformation stage may be kept small. In particular, if a high-frequency AC voltage is generated, such as in the range between 10 and 100 kHz, the transformer may be small. The efficiency of the overall arrangement can also be improved. Alternatively, the first DC voltage can be increased by driving an oscillating circuit via the bridge circuit.

Further features and advantages of the invention can be extracted from the following description of an embodiment of the invention, from the figures of the drawing showing details which are essential to the invention, and from the claims. The individual features may be realized individually or collectively in arbitrary combination in a variant of the invention.

DESCRIPTION OF DRAWINGS

Like reference symbols in the various drawings indicate like elements.

DETAILED DESCRIPTION

Figure 1:
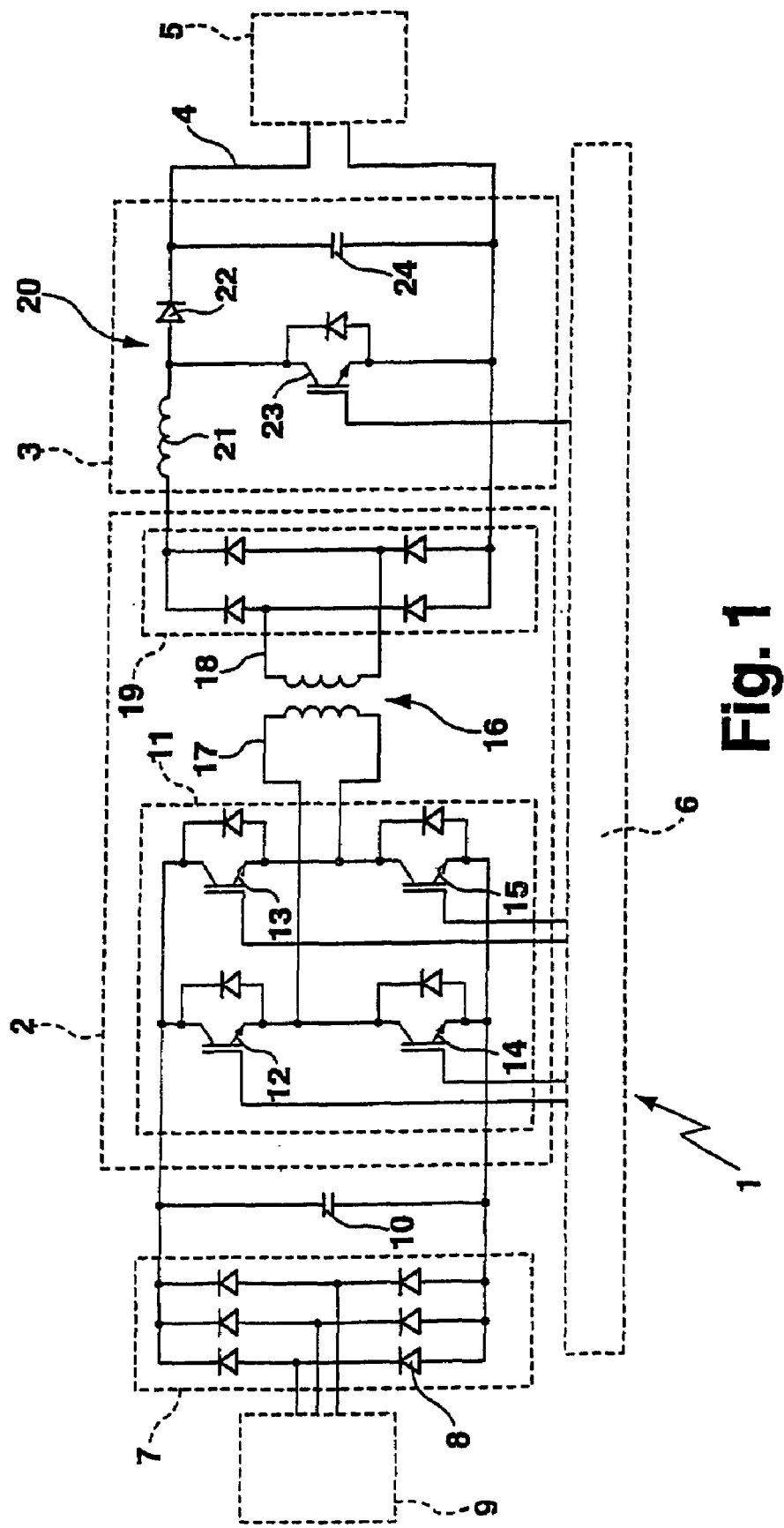
FIG. 1 shows a first illustration in the form of a circuit diagram of a plasma process DC voltage supply unit.

FIG. 1 shows a plasma process DC voltage supply unit 1 with a first voltage transformation stage 2 and a second voltage transformation stage 3 connected to the first voltage transformation stage. A load 5, such as a gas discharge or plasma process, is connected to the output 4 of the second voltage transformation stage 3. The first voltage transformation stage 2 and the second voltage transformation stage 3 are driven by a common control unit 6. A first DC voltage is supplied to the first voltage transformation stage 2. In this embodiment, the first DC voltage is generated from a mains voltage of a mains supply 9, using a rectifier 7 which contains several diodes 8. An intermediate circuit capacitor 10 for storing energy is connected between the rectifier 7 and the first voltage transformation stage 2.

The input DC voltage is transformed into an AC voltage by an inverter 11 in the first voltage transformation stage 2. The inverter 11 has a bridge circuit formed by switching elements 12 through 15. In this example, the switching elements 12 through 15 are transistors and are driven by the control unit 6. An AC voltage can be generated at the output of the inverter 11 through suitable driving of the switching elements 12 through 15, such that the amplitude of the AC voltage is less than or equal to the first DC voltage present at the input. The amplitude can, however, be reduced through driving of the switching elements 12 through 15. Driving may be effected according to a PWM (pulse width modulation) method or phase-shift method, for example. Both methods operate with a fixed frequency "f" and hence with a fixed period duration of T=1/f. To prevent a short-circuit, the switching elements 13, 14 must be switched off when the switching elements 12, 15 are switched on, and vice versa. The maximum turn-on time for symmetric driving is thereby limited to T/2. In the PWM method, the diagonally arranged switching elements 12, 15, as well as the diagonally arranged switching elements 13, 14, are simultaneously switched on and off. The turn-on time is controlled between 0 and T/2 in each case. In the phase-shift method, the turn-on time is always T/2. The switching elements 12, 14 (which are disposed below one another) as well as the switching elements 13, 15 are switched on and off with an offset of exactly T/2. For control, the moment at which the switching element 13 is switched on is shifted relative to the moment at which the switching element 12 is switched on, the time shift being between 0 and T/2. This means that the phase position is shifted.

The wave shape of the AC voltage can also be influenced by the bridge circuit. The AC voltage at the output of the inverter 11 is applied to a transformer 16, which in this example performs galvanic isolation. In this embodiment, the winding number on the primary side 17 corresponds to the winding number on the secondary side 18, such that no voltage transformation is carried out. It is, however, also feasible to transform the AC voltage on the primary side to a higher or lower value by the transformer 16. AC voltage at the secondary-side of the transformer 16 is transformed into a second DC voltage by a rectifier 19. At the output of the first voltage transformation stage 2, a relatively small output voltage is desirable, which may be selected to be, for example, 650 V. If a higher second DC voltage is required, the diodes of the rectifier 19 and the switching elements 12-15 would have to be correspondingly designed. Components of this type are relatively expensive and have other disadvantages. If the predetermined first DC voltage is smaller, the components of the first voltage transformation stage may be smaller. Moreover, there are fewer requirements as regards dielectric strength and resistance to surface leakage current of the insulators. Prevention of internal arcing is facilitated. The safety distance between the components may be smaller, which produces a more compact overall construction. Only the components of the second current transformation stage 3 must be designed to bear higher voltages, which are required, in particular, for striking a plasma process.

The second DC voltage at the output of the first voltage transformation stage 2 is applied to the input of the second voltage transformation stage 3. The second voltage transformation stage 3 has a boost converter 20 which comprises a coil 21, a diode 22, a switching element 23 and a filter capacitor 24. Depending on how the switching element 23 is switched by the control unit 6, the input DC voltage is either connected through to load 5 or transformed to a higher voltage. During the turn-on phase of the switching element 23, the input voltage drops at the inductance 21. The current through the inductance 21 increases linearly. If the switching element 23 turns off, the current continues to flow via the diode 22 and charges the filter capacitor 24. This means that energy is charged into the inductance 21 during the turn-on phase. It is transferred to the filter capacitor 24 during the blocking phase of the switching element 23. If the switching element 23 is not clocked (i.e., driven with a certain pulse-duty factor), the filter capacitor 24 is charged via the inductance 21 and the diode 22 is charged to the second DC voltage. If the switching element 23 is clocked, the output voltage at the output 4 rises to values which are higher than the second DC voltage. During continuous operation, the output voltage at the output 4 depends only on the pulse-duty factor and the second DC voltage (in other words, the input voltage of the second voltage transformation stage 3). The output voltage does not depend on the load.

The pulse-duty factor of the switching element 23 is controlled, since in the uncontrolled operation, in particular if driven with a fixed pulse-duty factor, the boost converter 20 would not be resistant to open circuit operation. Energy is pumped from the inductance 21 into the filter capacitor 24 with each cycle. For this reason, the output voltage would increase continuously during open circuit operation until components are destroyed. The pulse-duty factor is adjusted by the control unit 6.

Figure 2:
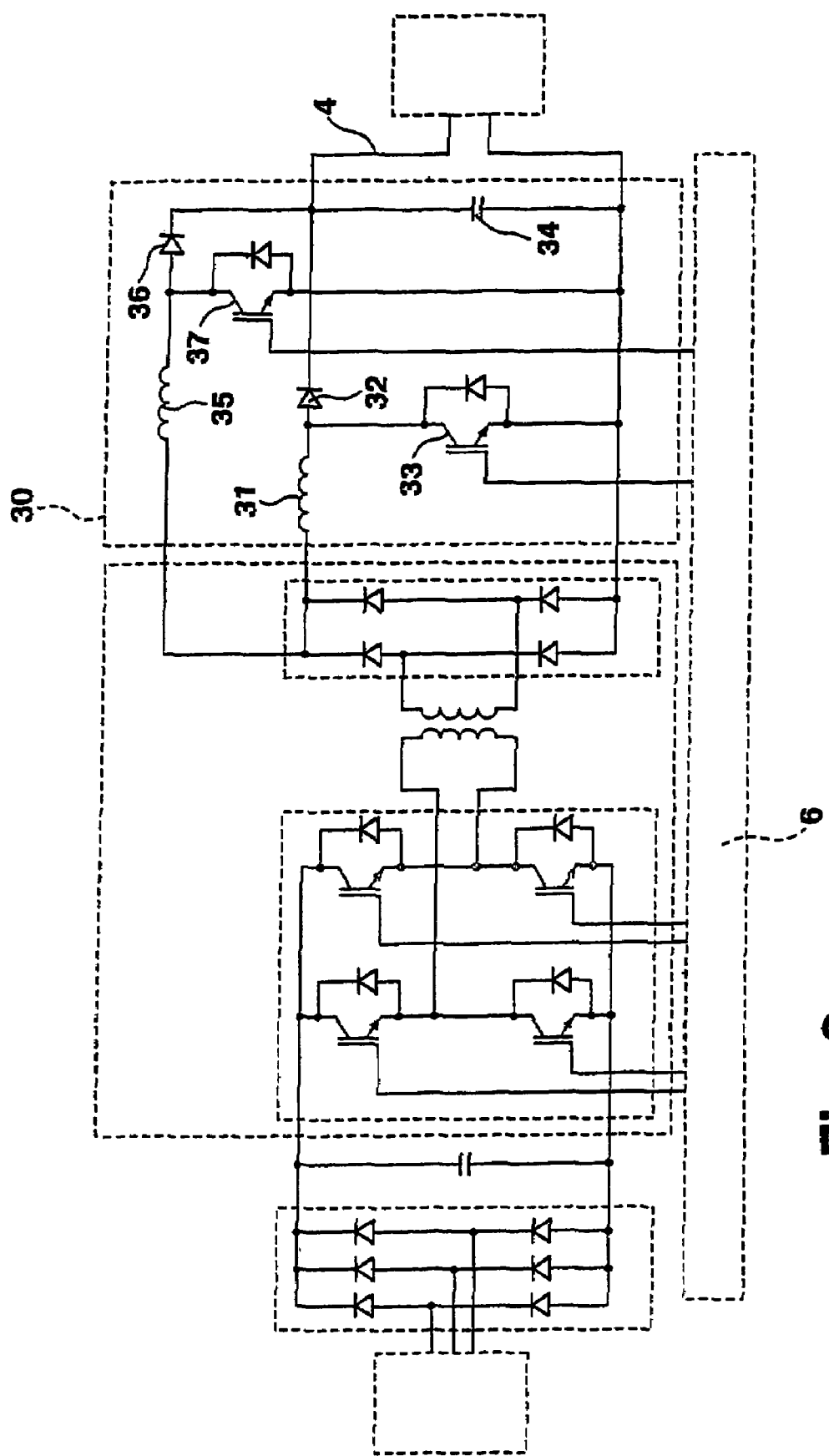
FIG. 2 shows a second embodiment of a plasma process DC voltage supply unit.

In the embodiment of FIG. 2, the second voltage transformation stage 30 has two boost converters connected in parallel. The first boost converter includes the inductance 31, the diode 32, the switching element 33 and the filter capacitor 34. The second boost converter includes the inductance 35, the diode 36, the switching element 37 and also the filter capacitor 34. The two boost converters have a common filter capacitor 34. The switching elements 33, 37 are driven by the control means 6 temporally offset with a controlled pulse-duty factor. The temporally offset driving has the effect that each switching element 33, 37 can be operated at a relatively low frequency. The filter capacitor 34 is alternately supplied with energy by the two boost converters, thereby generating the output voltage. This mode of operation is particularly gentle on the components and relatively inexpensive, as commercially available components can be used. The input DC voltage of the second voltage transformation stage 30 can be connected through to the output 4 by suitable driving of the switching elements 33, 37.

In a method for generating an output DC voltage of a gas discharge power supply unit 1, in which in a first voltage transformation stage 2 a first DC voltage is transformed into a second DC voltage of a predetermined voltage range, and the output DC voltage is generated from the second DC voltage in a second voltage transformation stage 3, a switching element 23 of at least one boost converter 20 is switched with a controlled pulse-duty factor in the second voltage transformation stage to generate the output DC voltage. This method permits striking and maintenance of the plasma process.

A number of embodiments of the invention have been described. Nevertheless, it will be understood that various modifications may be made without departing from the spirit and scope of the invention. Accordingly, other embodiments are within the scope of the following claims.

What is claimed is:

1. A method of providing a DC voltage to a gas discharge process, the method comprising:
    transforming a first DC voltage into a second DC voltage;
    generating an output DC voltage from the second DC voltage including switching respective switching elements of at least two boost converters with a controlled pulse-duty factor in a temporally offset manner; and
    supplying the output DC voltage to a gas discharge process wherein the at least two boost converters are connected in parallel and at one side are connected to the second DC voltage.

2. The method of claim 1, wherein the second DC voltage is higher than the first DC voltage.

3. The method of claim 1, comprising driving the switching element at a frequency of at least 18 kHz.

4. The method of claim 1, including controlling both switching elements at the same frequency or a multiple of a predetermined basic frequency.

5. The method of claim 1, wherein the first DC voltage is generated from a mains voltage through rectification.

6. The method of claim 1, wherein the second DC voltage is less than about 650 volts as generated from the first DC voltage, and the output voltage is of a voltage greater than about 600 volts, as generated from the second DC voltage.

7. The method of claim 1, wherein the second DC voltage is between 50 and 650 Volts.

8. The method of claim 1, wherein the output voltage is between 600 and 2000 Volts.

9. The method of claim 1, wherein each boost converter includes only one boost inductor, and each boost inductor is directly connected to the second DC voltage.

10. The method of claim 1, wherein transforming the first DC voltage comprises:
    initially transforming the first DC voltage into an AC voltage; and
    rectifying the AC voltage to produce the second DC voltage.

11. The method of claim 10, wherein the AC voltage is generated by a bridge circuit of switching elements, the method including driving the switching elements in a pulse-width modulated or phase-shifted manner.

12. The method of claim 11, further comprising driving the switching elements of the bridge circuit and the switching elements of the at least two boost converters at the same frequency or at a multiple of a predetermined basic frequency.

13. The method of claim 11, wherein the AC voltage is transformed before rectification.

14. A plasma process DC voltage supply unit comprising:
    a first voltage transformation stage that transforms a first DC voltage into a second DC voltage; and
    a second voltage transformation stage that transforms the second DC voltage into an output DC voltage;
    the second voltage transformation stage including at least two boost converters connected in parallel and including switching elements driven with a controlled pulse-duty factor in a temporally offset manner, wherein the at least two boost converters are connected at one side to the second DC voltage.

15. The plasma process DC voltage supply unit of claim 14, further comprising a control unit that controls the first and second voltage transformation stages.

16. The plasma process DC voltage supply unit of claim 14, wherein the boost converters share a common filter capacitor.

17. The plasma process DC voltage supply unit of claim 14, wherein each boost converter of the second voltage transformation stage includes only one boost inductor, wherein each boost inductor is directly connected to the second DC voltage.

18. The plasma process DC voltage supply unit of claim 14, wherein the first voltage transformation stage comprises:
    an inverter that generates an AC voltage from the first DC voltage;
    a transformer connected to the inverter, the transformer configured to transform the AC voltage generated by the inverter; and
    a rectifier that generates the second DC voltage from the transformed AC voltage.

19. The plasma process DC voltage supply unit of claim 18, wherein the inverter comprises a bridge circuit.

* * * * *